(12) United States Patent
Ko

(10) Patent No.: US 7,910,466 B2
(45) Date of Patent: Mar. 22, 2011

(54) METHOD OF MANUFACTURING HIGH-VOLTAGE SEMICONDUCTOR DEVICE AND LOW-VOLTAGE SEMICONDUCTOR DEVICE

(75) Inventor: Choul Joo Ko, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 1119 days.

(21) Appl. No.: 11/645,657

(22) Filed: Dec. 27, 2006

(65) Prior Publication Data

US 2007/0155107 A1    Jul. 5, 2007

(30) Foreign Application Priority Data

Dec. 29, 2005   (KR) .................. 10-2005-0134204

(51) Int. Cl.
  *H01L 21/425*   (2006.01)
(52) U.S. Cl. ........ 438/514; 438/530; 438/542; 438/548; 438/549; 257/E27.064

(58) Field of Classification Search .................. None
  See application file for complete search history.

(56) References Cited

U.S. PATENT DOCUMENTS

| 5,498,554 | A | * | 3/1996 | Mei ................... 438/200 |
| 5,780,907 | A | | 7/1998 | Ema et al. |
| 6,090,652 | A | * | 7/2000 | Kim ................... 438/228 |
| 6,309,921 | B1 | | 10/2001 | Ema et al. |

FOREIGN PATENT DOCUMENTS

JP          8097378          4/1996

* cited by examiner

*Primary Examiner* — Zandra Smith
*Assistant Examiner* — Khanh B Duong
(74) *Attorney, Agent, or Firm* — Lowe Hauptman Ham & Berner LLP

(57) ABSTRACT

A high-voltage semiconductor device and a method for making the same are provided. A high-voltage semiconductor device and a low-voltage semiconductor device are formed in a single substrate, a photolithography process that is required to form a high-voltage well region is omitted, and the well region of the high-voltage semiconductor is formed together with the well region of the low-voltage semiconductor device formed in another photolithography process.

10 Claims, 6 Drawing Sheets

US 7,910,466 B2

METHOD OF MANUFACTURING HIGH-VOLTAGE SEMICONDUCTOR DEVICE AND LOW-VOLTAGE SEMICONDUCTOR DEVICE

CLAIM OF PRIORITY UNDER 35 U.S.C. §119

The present application claims priority to Korean patent application No. KR 2005-0134204, filed in the Korean Patent Office on, Dec. 29, 2005, the entire contents of which is hereby incorporated by reference herein.

FIELD OF THE INVENTION

The present invention relates to a semiconductor device. In particular, the present invention relates to a high-voltage semiconductor device and a method of manufacturing the same.

BACKGROUND OF THE INVENTION

High-voltage devices are used as the core components of semiconductor devices for automobiles, or as the core components of semiconductor devices for networks or the driving of displays. As an example, among high-voltage devices, a 15 Volt (V) bidirectional high-voltage device is integrated with a low-voltage device in the same chip, and is chiefly used at the output stage of the data driver Integrated Circuit (IC) of a Liquid Crystal Display (LCD) or an Organic Light Emitting Diode (OLED) display.

In particular, the data driver IC for a display is configured such that a single output unit includes a minimum of 240 terminals and a maximum of 640 terminals, so that the uniformity of these output terminals directly affects the uniformity of image quality of a display. Accordingly, it is very important to insure that the output terminals of the data drive IC have uniform electrical characteristics.

FIG. 1 is a sectional view of a conventional high-voltage device, in accordance with the prior art.

The high-voltage device 10 shown in FIG. 1 is an NMOS transistor. The NMOS transistor 14 is formed in a P-type well 18 formed in a substrate 12, and includes a source and a drain, which are formed in respective N-type drift regions 20 and 22, and a gate 26, which is disposed on a gate insulating layer 24. Spacers 27 are formed on respective sidewalls of the gate 26. The NMOS transistor 14 is electrically connected to the outside via a source electrode 32, a gate electrode 30 and a drain electrode 34 that are insulated from each other by an interlayer insulating layer 36.

A conventional process of manufacturing the high-voltage NMOS device 10 is described below, according to the prior art (refer to a flowchart shown in dotted lines in the right portion of FIG. 3). At Event 200, a wafer is prepared, at Event 202, a mask pattern for forming a High-Voltage (HV) well 18 is formed on a substrate 12, and, at Event 204, P-type dopants are ion-implanted into the substrate. The ion-implanted dopants are diffused into the substrate, and a high-voltage P-type well 18 is formed, at Event 206, through a high-temperature (for example, 1200° C.) drive-in process to increase the breakdown voltage of the semiconductor device. Thereafter, the mask pattern is removed, at Event 208, another mask pattern for forming the drift regions 20 and 22 is formed, at Event 210, N-type dopants are ion-implanted into the substrate using the pattern, and, at Event 212, the N-type drift regions 20 and 22 are formed in the high-voltage P-type well 18 through a high-temperature (for example, 1150° C.) drive-in process to increase breakdown voltage.

The well region 18 and the drift regions 20 and 22 are formed through the above-described processes to form the high-voltage NMOS device 10 and, thereafter, a process of manufacturing a low-voltage device in the same wafer is performed. That is, at Event 214, device isolation oxide layers are formed in the substrate 12 through, for example, a Local Oxidation of Silicon (LOCOS) process, at Event 216, a Low-Voltage (LV) well pattern is formed, and, at Event 218, the low-voltage well (not shown in FIG. 1) is formed by performing ion implantation into the substrate using the pattern. Thereafter, at Event 220, a Rapid Thermal Process (RTP) or an annealing process is performed to cure the substrate, which was damaged by the ion implantation (for example, to compensate for stress to which the substrate was subjected, and uniformly align the crystalline structure of the substrate).

In order to form the conventional high-voltage NMOS device 10, two photolithography processes and two high-temperature drive-in processes are required to form the high-voltage well 18 and the drift regions 20 and 22. Accordingly, in order to form a high-voltage NMOS device and a high-voltage PMOS device on a single substrate, for example, using a 0.35 μm CMOS process, a total of four photolithography processes and a plurality of high-temperature drive-in processes are required.

SUMMARY OF THE INVENTION

It is, therefore, an object of the present invention to provide a method of manufacturing a high-voltage semiconductor device through a greatly reduced number of manufacturing process steps.

Another object of the present invention is to provide a method of manufacturing a high-voltage semiconductor device, in which the number of masks necessary to manufacture the high-voltage semiconductor device is reduced, thus improving the manufacturing yield of devices and, at the same time, improving the electrical characteristics of the high-voltage semiconductor device.

In a method of manufacturing a high-voltage semiconductor device according to the present invention, a high-voltage semiconductor device and a low-voltage semiconductor device are formed in a single semiconductor wafer and a photolithography process that is typically required to form a high-voltage well region is omitted. The well region of the high-voltage semiconductor is formed together with the well region of the low-voltage semiconductor device.

In accordance with an embodiment of the present invention, there is provided a method of manufacturing a high-voltage semiconductor device, the high-voltage semiconductor device being formed together with a low-voltage semiconductor device in a single wafer, the method comprises the steps of preparing a semiconductor substrate, forming device isolation layers in the semiconductor substrate, and forming the well region of the high-voltage semiconductor device by performing a first ion implantation process on the semiconductor substrate using an optical mask having both a first pattern for forming a well region of the low-voltage semiconductor device and a second pattern for forming the well region of the high-voltage semiconductor device. The method also comprises the steps of forming drift regions in the well regions by performing a second ion implantation process on the semiconductor substrate and annealing the semiconductor substrate.

The first and second ion implantation processes may be performed such that the concentration of dopants in the drift regions is lower than that of dopants in the well region in junction regions between the drift regions and the well region.

Furthermore, the second ion implantation process for forming the drift region may include a primary ion implantation process of implanting N-type dopants (for example, Phosphorus) at high energy (for example, 480 KeV), and a secondary ion implantation process of implanting N-type dopants at intermediate energy.

In accordance with another embodiment of the present invention, the second ion implantation process for forming the drift region may comprise a primary ion implantation process of implanting P-type dopants (for example, boron) at intermediate energy (for example, 180 KeV), and a secondary ion implantation process of implanting P-type dopants at intermediate energy.

The well region may be formed such that a region thereof having a highest concentration is located in the substrate, and dopants have a retrograde distribution in a range from a location having the highest concentration to a surface of the substrate.

Another embodiment of the invention is defined by a high-voltage semiconductor device that is formed in accordance with the steps of preparing a semiconductor substrate, forming device isolation layers in the semiconductor substrate, and forming the well region of the high-voltage semiconductor device by performing a first ion implantation process on the semiconductor substrate using an optical mask having both a first pattern for forming a well region of the low-voltage semiconductor device and a second pattern for forming the well region of the high-voltage semiconductor device. The device is also formed by the steps of forming drift regions in the well regions by performing a second ion implantation process on the semiconductor substrate and annealing the semiconductor substrate.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, embodiments of the present invention will be described in detail with reference to the accompanying drawings.

Figure 1:
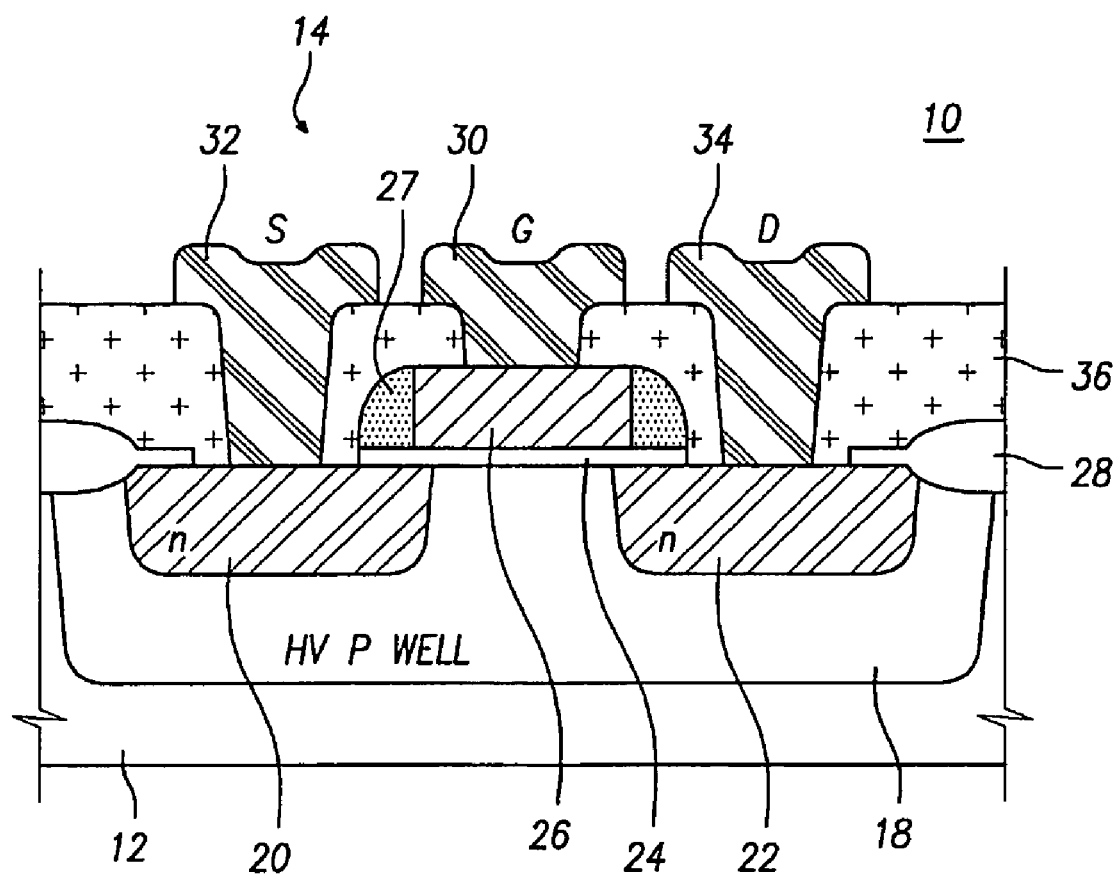
FIG. 1 is a sectional view of a conventional high-voltage semiconductor device, in accordance with the prior art.
Figure 2:
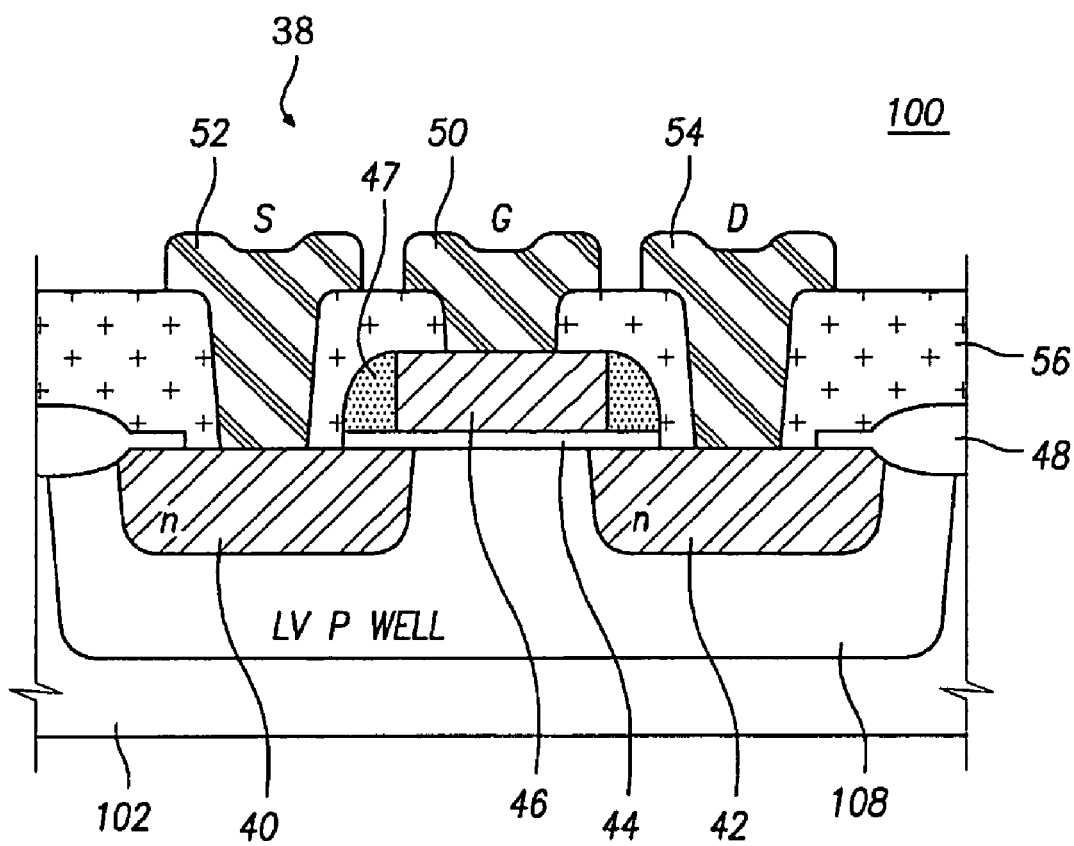
FIG. 2 is a sectional view of a high-voltage semiconductor device, according to the present invention.

FIG. 2 is a sectional view of a high-voltage semiconductor device according to the present invention.

Referring to FIG. 2, the high-voltage semiconductor device 100, by example, NMOS transistor 38, is formed in a low-voltage P-type well 108 formed in a substrate 102. N-type drift regions 40 and 42 are formed in the low-voltage P-type well 108. The high-voltage NMOS transistor device 38 includes a source and a drain, which are formed in the respective N-type drift regions 40 and 42, and a gate 46, which is disposed on a gate insulating layer 44. Spacers 47 are formed on respective sidewalls of the gate 46. The high-voltage NMOS transistor 38 is electrically connected to the outside via a source electrode 52, a gate electrode 50 and a drain electrode 54 that are insulated by an interlayer insulating layer 56.

Figure 3:
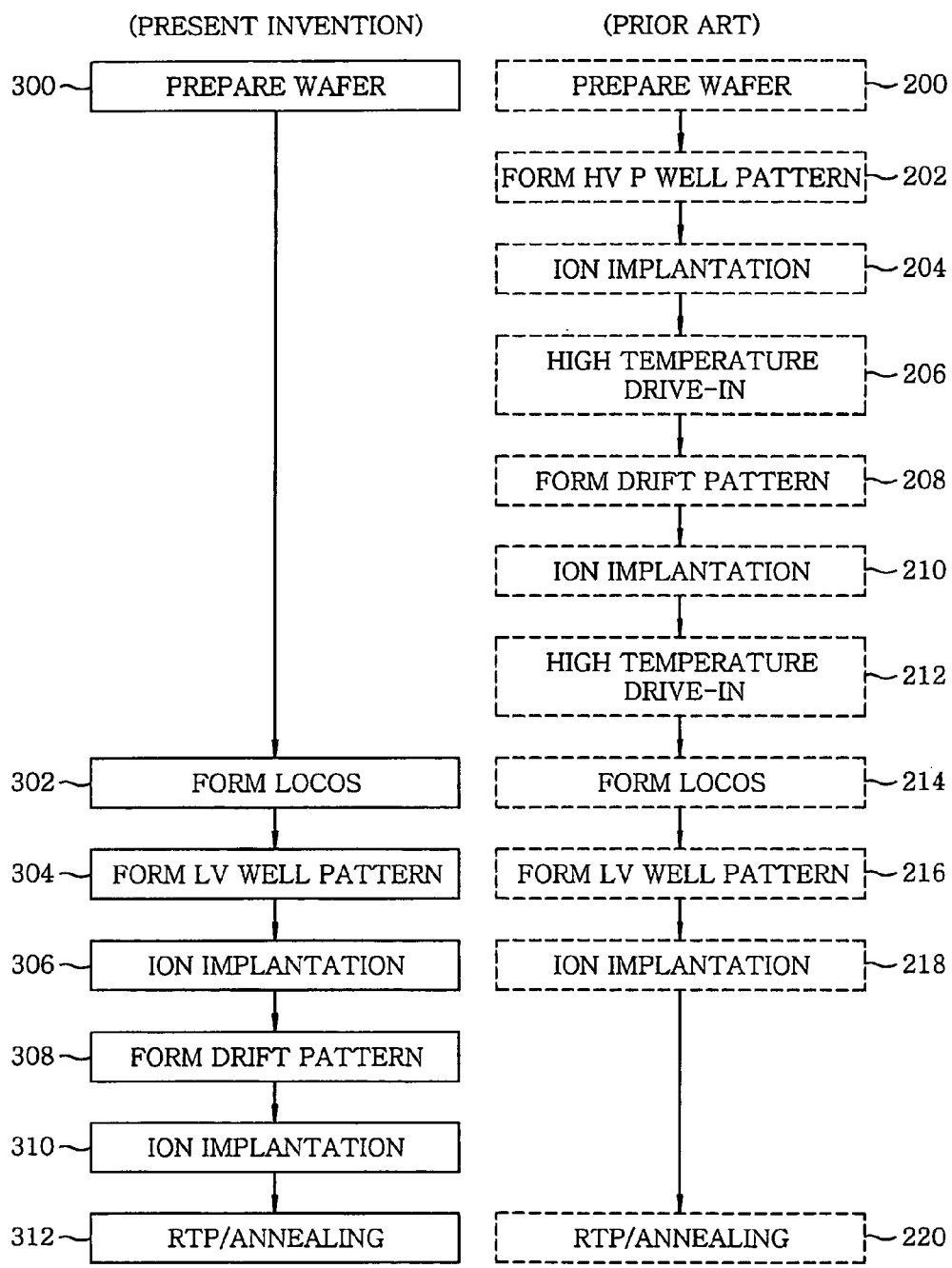
FIG. 3 is a flowchart illustrating a process of manufacturing a high-voltage semiconductor device, according to the present invention and, in comparison with, a process of manufacturing a conventional high-voltage semiconductor device, according to the prior art.

FIG. 3 is a flowchart illustrating a process of manufacturing a high-voltage semiconductor device according to the present invention in comparison with a process of manufacturing a conventional high-voltage semiconductor device.

Referring to FIG. 3, in the method of manufacturing a high-voltage semiconductor device according to the present invention, the process of forming a high-voltage P-type well mask pattern (Event 202) and related ion implantation (Event 204), the first high-temperature drive-in process (Event 206), the process of forming drift regions (Event 208) and related ion implementation (Event 210), and the second high-temperature drive-in process (Event 212), which are performed after the step of preparing a wafer, are omitted or postponed, and the step of forming device isolation layers (for example, LOCOS) is immediately performed.

According to the method of the present invention, at Event 300, the wafer is prepared and, at Event 302, device isolation oxide layers are formed in the substrate 102 through, for example, a Local Oxidation of Silicon (LOCOS) process. After the step of forming the device isolation has been performed, the P-type well 108 of the high-voltage NMOS device 100 is formed through a process of forming a low-voltage well. That is, at Event 304, a first mask pattern for forming the low-voltage well in the semiconductor substrate 102 is formed. At Event 306, P-type dopants, for example, boron (B), gallium (Ga) or indium (In), are ion-implanted into the substrate 102 using the first mask pattern. In this case, the first mask pattern may include both a pattern for forming a well region for the low-voltage semiconductor device and a pattern for forming a well region for the high-voltage semiconductor device 100.

After the first mask pattern has been removed, at Event 308 a second mask pattern for forming the drift regions 40 and 42 is formed on the substrate 102, and, at Event 310, N-type dopants, for example, phosphorus (Ph) or antimony (Sb), are ion-implanted into the substrate 102 using the second mask pattern. Thereafter, at Event 312, as the RTP or the annealing process, which is conventionally performed, is performed, the substrate 102 damaged by two ion implantation processes performed is cured and, at the same time, the ion-implanted dopants are driven into the substrate 102, therefore the drift regions 40 and 42 are realized.

After the well region 102 and the drift regions 40 and 42 for the high-voltage NMOS device 100 are formed through the aforementioned processes, a typical process of forming the interlayer insulating layer 28, the gate 50, the source electrode 52 and the drain electrode 54 is performed in the same manner as in the conventional method.

That is, in the method of manufacturing a high-voltage semiconductor device according to the present invention, the photolithography process required to form the high-voltage well is omitted, so that the number of masks is reduced correspondingly. Furthermore, the high-temperature drive-in process, which has been performed after the ion implantation process for the high-voltage well, is also unnecessary. Furthermore, in the present invention, a separate high-temperature drive-in process is unnecessary after the ion implantation process for the drift regions has been performed, and this process is replaced with the RTP or annealing process, which has been performed after the ion implantation process for the well of the low-voltage semiconductor device, so that one or more high-temperature drive-in processes can be omitted.

In the present invention, omitting the photolithography process and the high-temperature drive-in process as described above is possible because breakdown voltage is increased sufficiently only when using the ion implantation process for a low-voltage semiconductor device and the ion implantation process for drift regions, and thus operation as a high-voltage semiconductor device can be performed.

Figure 4:
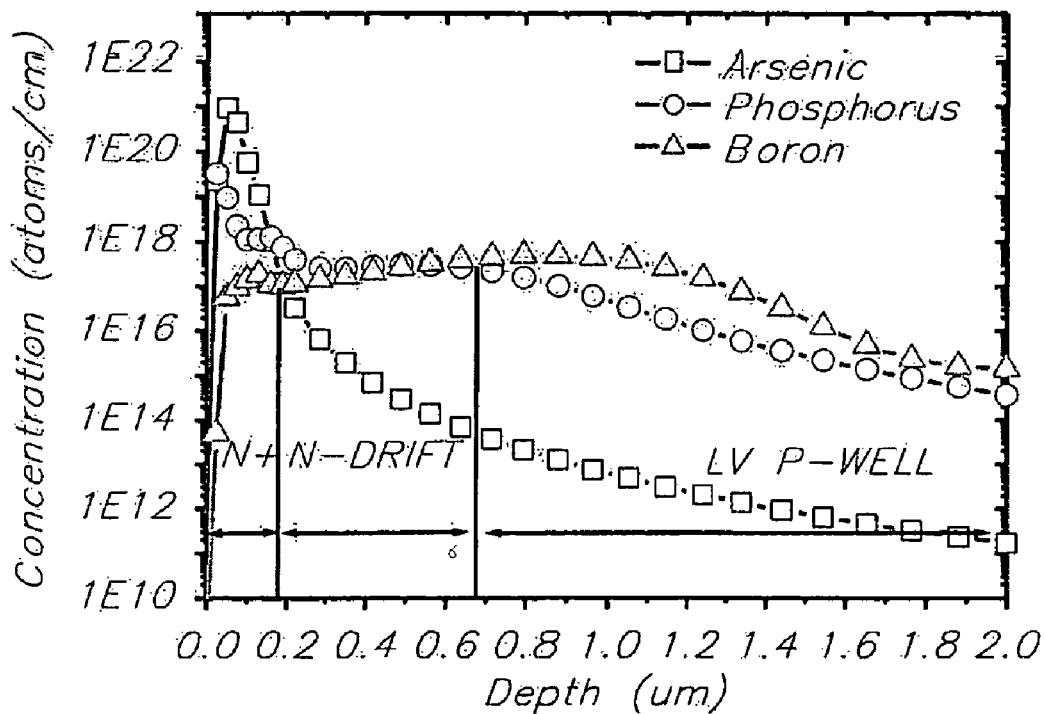
FIG. 4 is a graph showing the concentration distribution of dopants, which are ion-implanted in a range from the surface of a substrate to a depth of 2 μm, according to an embodiment of the present invention.

According to an embodiment of the present invention, in order to manufacture the high-voltage NMOS device 100, boron is ion-implanted into the P-type well region, as shown in the distribution of FIG. 4.

FIG. 4 is a graph showing the concentration distribution of dopants, which are ion-implanted in a range from the surface of the substrate 102 to a depth of 2 μm. FIG. 4 shows an example in which the N+ region, which is formed by ion-implanting arsenic (As) into the surface of the substrate 102 at a high concentration, is formed from the surface of the substrate to a depth of about 0.2 μm, and the drift regions 40 and 42, which are formed by ion-implanting phosphorus, are formed from the surface of the substrate 102 to a depth of about 0.7 μm, and the well region 108 is formed by ion-implanting boron.

As shown in FIG. 4, the P-type well 108 exhibits retrograde distribution in a range from a region in which the concentration of boron is highest to the surface of the substrate 102. The concentration of boron is 5.0E17 at a depth of 0.79 μm. In contrast, the concentration of boron in the conventional, prior art, high-voltage P-type well 18 is 1.33E16 at a depth of 0.8 μm, which is very low when compared to that of boron in the P-type well 108 of the present invention. Accordingly, the present invention is designed such that the concentration of phosphorus is 2.98E17 at a depth of 0.7 μm and the junction depth of each of the drift regions 40 and 42 is 0.6 μm. The breakdown voltage increases as the junction depth of the drift regions becomes deeper and the concentration of dopants present in the drift regions becomes lower than that of dopants present in the well region. Accordingly, even though the high-voltage NMOS device 100 of the present invention is formed through the process of forming a low-voltage well, it can be imparted with a high breakdown voltage without requiring use of the high-temperature drive-in processes after the formation of the drift regions.

A process of forming the drift regions 40 and 42 is described below.

A photoresist film is applied to the surface of the substrate 102 and is exposed to light using an optical mask having a drift pattern, a drift pattern is transferred onto the photoresist film, the photoresist film is developed, and therefore the drift pattern (that is, the photoresist film pattern) is formed on the substrate 102. Phosphorus, which is N-type dopants, is primarily ion-implanted into the semiconductor substrate 102. The primary ion implantation process is performed, for example, at a high energy of 480 KeV (kilo electronvolts). Thereafter, a secondary ion implantation process is performed using the same drift pattern, which is performed at intermediate energy. That is, the drift regions 40 and 42 of the high-voltage NMOS semiconductor device 100 is performed through a primary ion implantation process using high energy and through a secondary ion implantation process using intermediate energy.

The electrical characteristics of the high-voltage NMOS semiconductor device 100 formed as described above were analyzed.

Figure 5:
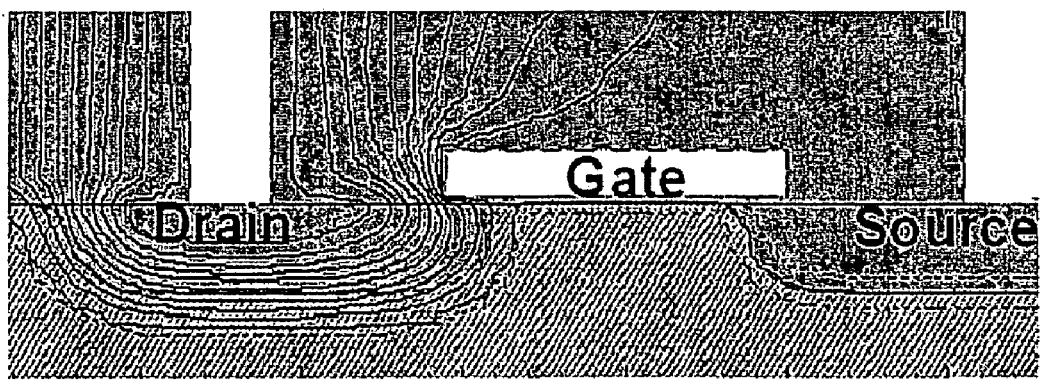
FIG. 5 is a diagram showing a voltage distribution characteristic obtained when a 15 V high-voltage NMOS semiconductor device is formed, a voltage of 20 V is applied to the drain electrode thereof, and the other electrodes are grounded, according to an embodiment of the present invention.

FIG. 5 is a diagram showing a voltage distribution characteristic obtained when a 15 V high-voltage NMOS semiconductor device is formed, a voltage of 20 V is applied to the drain electrode thereof, and the other electrodes are grounded, according to an embodiment of the present invention.

As shown in FIG. 5, the electrical field of the high-voltage NMOS transistor 100 is densely distributed in a junction region between one of the drift regions 40 and 42 and the well region 108. Accordingly, breakdown occurs in the junction portion. The region in which the breakdown has occurred is indicated by a circle in FIG. 5.

Figure 6:
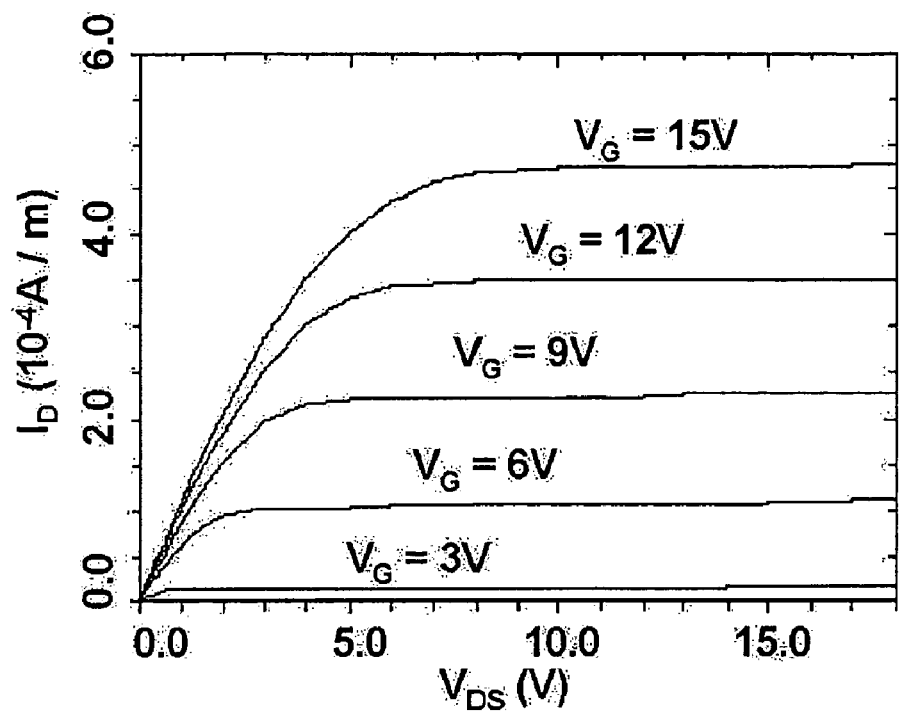
FIG. 6 is an I-V characteristic curve of the high-voltage NMOS transistor according to the embodiment of the present invention.

FIG. 6 is an I-V characteristic curve of the high-voltage NMOS transistor 100 according to the embodiment of the present invention.

From the characteristic curve of FIG. 6, it can be seen that the high-voltage NMOS semiconductor device 100 according to the embodiment of the present invention can operate at gate voltage ($V_G$) levels ranging from 15 V to 18 V and that the saturation characteristic thereof is excellent. The reason for this is because the N-type drift regions 40 and 42 formed in the P-type well 108 are designed to endure internal voltage.

Although, up to this point, the high-voltage semiconductor device of the present invention has been described on the basis of an NMOS transistor, the present invention may also be applied to a PMOS transistor. Hereinafter, a description of a high-voltage PMOS semiconductor device according to the present invention is given.

High-Voltage PMOS Semicoductor Device

When the present invention is applied to the high-voltage PMOS semiconductor device, the manufacturing process thereof is the same as the manufacturing process of voltage PMOS semiconductor device, which has been described with reference to FIG. 3. That is, the N-type well of the high-voltage PMOS transistor is formed using an optical mask for a low-voltage well and, thereafter, an ion implantation process for P-type drift regions is immediately performed with omission of the high-temperature drive-in process.

Concentration distribution in the N-type well of the high-voltage PMOS semiconductor device is also a retrograde distribution, like that in the P-type well of the high-voltage NMOS semiconductor device.

In order to form the P-type drift regions in the N-type well, the present invention is designed such that the junction depth of each of the P-type drift regions is, for example, 0.5 μm, through a high-energy ion implantation process, and the concentration of boron, which is the dopant present in the drift regions, is lower than that of phosphorus present in the n-type well. By doing so, the breakdown voltage can be increased, for example, to a voltage level of 19 V.

When the drift regions of the high-voltage PMOS semiconductor device are formed, boron is projected deeper than phosphorus per unit of energy, unlike the case where the drift regions of the NMOS semiconductor device are formed, so that a primary ion implantation process is performed, for example, at an intermediate energy of 180 KeV, and then a secondary ion implantation process is performed at the intermediate energy.

Voltage distribution depending on the drain current of the high-voltage PMOS semiconductor device, formed as described above, is shown in FIG. 7.

Figure 7:
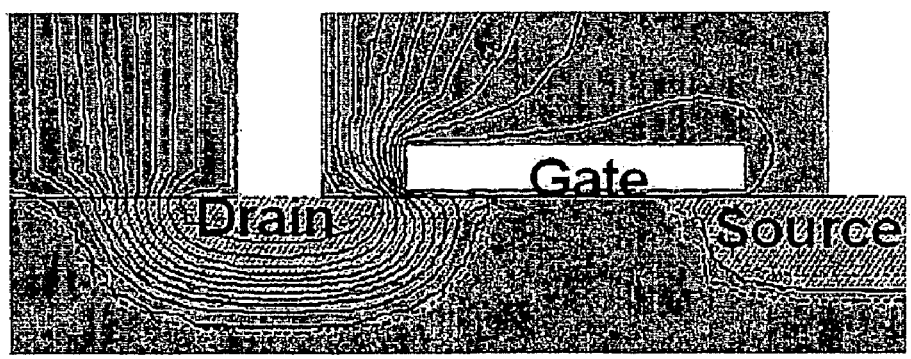
FIG. 7 is a diagram showing a voltage distribution characteristic obtained when a 15 V high-voltage PMOS semiconductor device is formed, a voltage of −20 V is applied to the drain electrode thereof, and the other electrodes are grounded, according to an embodiment of the present invention.

FIG. 7 is a diagram showing a voltage distribution characteristic obtained when a 15 V high-voltage PMOS semiconductor device is formed, a voltage of −20 V is applied to the drain electrode thereof, and the other electrodes are grounded, according to an embodiment of the present invention. As shown in FIG. 7, breakdown occurs in a junction region between one of the P-type drift regions and the N-type well. The reason why the above-described breakdown occurs in the junction region is because a Reduced Surface Field (RESURF) phenomenon occurs. Accordingly, the high-voltage PMOS semiconductor device has a very high breakdown voltage level, for example, a voltage level of 19 V.

Figure 8:
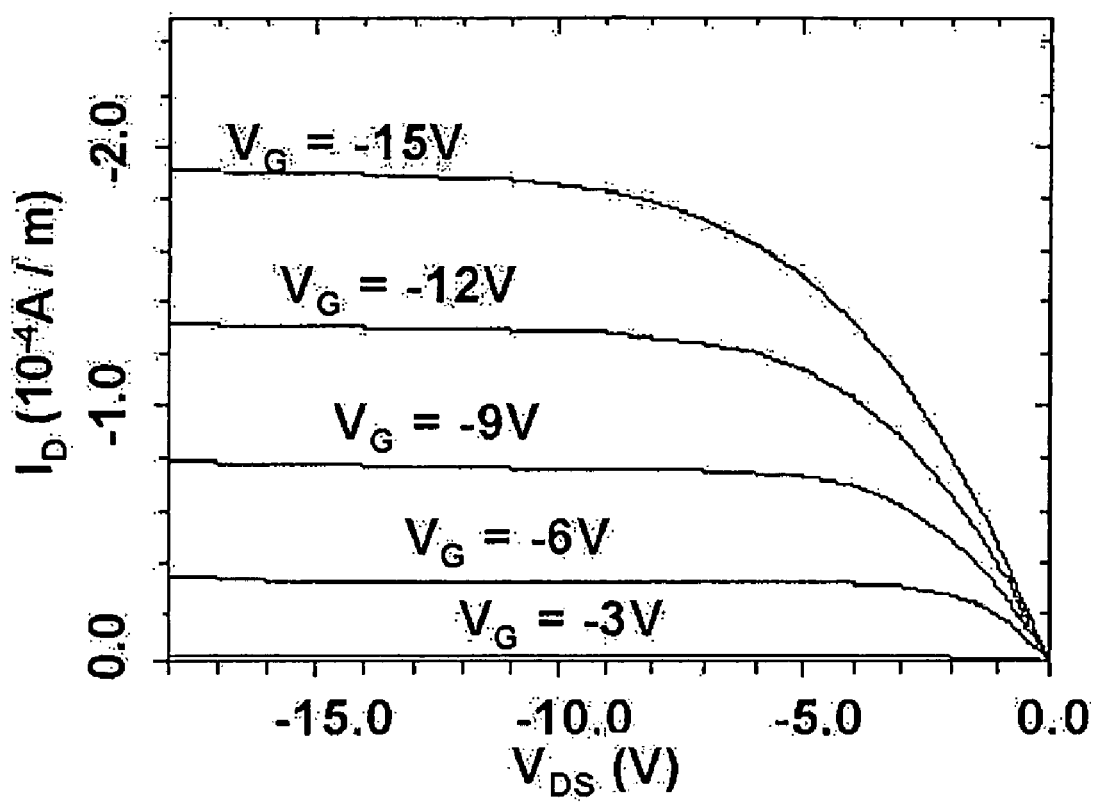
FIG. 8 is a diagram showing a current-voltage characteristic of the high-voltage PMOS transistor according to the embodiment of the present invention.

From the I-V characteristic curve of the high-voltage PMOS semiconductor device of the present invention, shown in FIG. 8, it can be seen that a saturation current characteristic is excellent.

Table 1 below gives the electrical characteristics of the high-voltage NMOS semiconductor device and the high-voltage PMOS semiconductor device according to the present invention and of a conventional high-voltage semiconductor device.

TABLE 1

| Classification | | Drive current (μA/μm) | BVdss (V) | S(mV/dec) | Vt(B) |
|---|---|---|---|---|---|
| Conventional structure | N type | 460 | 24 | | 1.02 |
| Present invention | P type | −210 | −24 | | −1.15 |
| Delta (%) | N type | 470 | 19 | 156.3 | 1.61 |
| | P type | −190 | −19 | 119.9 | −1.68 |
| | N type | 2.2 | −20.8 | | 57.8 |
| | P type | −9.5 | −20.8 | | 46.1 |

From the table described above, it can seen that the 15 V bidirectional high-voltage semiconductor device according to the present invention has a threshold voltage level Vtn or Vtp higher than those of the conventional high-voltage semiconductor device by about 0.6V because the respective threshold voltage levels Vtn and Vtp are 1.61 V and −1.68 V, and has drive current $I_{drive}$ similar to the conventional high-voltage semiconductor device because the drive current $I_{drive}$ is 470 μA/μm or −190 μA/μm.

According to the present invention, the high-voltage semiconductor device can be implemented using only ion implantation processes without performing separate high-temperature drive-in processes, so that the number of photolithography processes can be reduced to ½ compared to the conventional technology. Furthermore, high-temperature drive-in processes are omitted, and thus the manufacturing yield of the high-voltage semiconductor device is greatly improved.

Furthermore, the high-voltage semiconductor device according to the present invention exhibits an excellent breakdown voltage of 19 V, desired drive current characteristics, that is, 470 μA/μm in the case of the NMOS transistor and 190 μA/μm in the case of the PMOS transistor, excellent saturation region characteristics, and small variation in characteristics, so that it is suitable for use in analog circuitry, such as the output unit of the data drive IC of any display device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a high-voltage semiconductor device, the high-voltage semiconductor device being formed together with a low-voltage semiconductor device in a single wafer, the method comprising the steps of:
preparing a semiconductor substrate;
forming device isolation layers in the semiconductor substrate;
forming a well region of the high-voltage semiconductor device by performing a first ion implantation process on the semiconductor substrate using an optical mask having both a first pattern for forming a well region of the low-voltage semiconductor device and a second pattern for forming the well region of the high-voltage semiconductor device;
forming drift regions in the well regions by performing a second ion implantation process on the semiconductor substrate, the second ion implantation process comprising a primary ion implantation process of implanting N-type dopants at high energy, and a secondary ion implantation process of implanting N-type dopants at intermediate energy; and
annealing the semiconductor substrate.

2. The method of claim 1, wherein the first and second ion implantation processes are performed such that a concentration of dopants in the drift regions is lower than that of dopants in the well region in junction regions between the drift regions and the well region.

3. The method of claim 1, wherein the N-type dopants are boron, and the high energy is 480 KeV.

4. The method of claim 1, wherein the well regions are formed such that a region thereof having a highest concentration is located in the substrate, and dopants have a retrograde distribution in a range from a location having the highest concentration to a surface of the substrate.

5. The method of claim 1, wherein the primary and secondary ion implantation processes are performed using an identical drift pattern.

6. A method of manufacturing a high-voltage semiconductor device, the high-voltage semiconductor device being formed together with a low-voltage semiconductor device in a single wafer, the method comprising the steps of:
preparing a semiconductor substrate;
forming device isolation layers in the semiconductor substrate;
forming a well region of the high-voltage semiconductor device by performing a first ion implantation process on the semiconductor substrate using an optical mask having both a first pattern for forming a well region of the low-voltage semiconductor device and a second pattern for forming the well region of the high-voltage semiconductor device;
forming drift regions in the well regions by performing a second ion implantation process on the semiconductor substrate, the second ion implantation process comprising a primary ion implantation process of implanting P-type dopants at intermediate energy, and a secondary ion implantation process of implanting P-type dopants at intermediate energy; and annealing the semiconductor substrate.

7. The method of claim 6 wherein the P-type dopants are boron, and the intermediate energy is 180 KeV.

8. The method of claim 6, wherein the primary and secondary ion implantation processes are performed using an identical drift pattern.

9. The method of claim 6, wherein the first and second ion implantation processes are performed such that a concentration of dopants in the drift regions is lower than that of dopants in the well region in junction regions between the drift regions and the well region.

10. The method of claim 6, wherein the well regions are formed such that a region thereof having a highest concentration is located in the substrate, and dopants have a retrograde distribution in a range from a location having the highest concentration to a surface of the substrate.

* * * * *